United States Patent
Schuster et al.

(10) Patent No.: US 7,343,670 B2
(45) Date of Patent: Mar. 18, 2008

(54) METHOD OF MANUFACTURING TRANSVERSE NON-CYLINDRICAL GRADIENT COILS

(75) Inventors: Johann Schuster, Oberasbach (DE); Stefan Stocker, Großenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 444 days.

(21) Appl. No.: 11/049,571

(22) Filed: Feb. 2, 2005

(65) Prior Publication Data

US 2005/0198812 A1      Sep. 15, 2005

(30) Foreign Application Priority Data

Feb. 3, 2004   (DE) .................. 10 2004 005 278

(51) Int. Cl.
*H01F 7/06* (2006.01)
(52) U.S. Cl. .............. 29/606; 29/592.1; 29/602.1; 29/605; 310/179; 310/208; 336/212; 336/213; 347/68; 347/71
(58) Field of Classification Search ............. 29/592.1, 29/602.1, 605, 606; 310/179, 208; 336/212, 336/213; 347/68, 71
See application file for complete search history.

(56) References Cited

U.S. PATENT DOCUMENTS

| | | | |
|---|---|---|---|
| 3,849,010 A | * | 11/1974 | Herbenar .................... 403/138 |
| 5,512,828 A | | 4/1996 | Pausch et al. |
| 6,168,690 B1 | * | 1/2001 | Jewett et al. .......... 204/192.12 |
| 2002/0072666 A1 | | 6/2002 | Overweg et al. |

FOREIGN PATENT DOCUMENTS

| | | |
|---|---|---|
| DE | 40 17 260 A1 | 12/1990 |
| DE | 42 30 145 A1 | 3/1994 |
| DE | 44 22 782 A1 | 1/1996 |
| DE | 195 45 222 A1 | 6/1996 |
| DE | 696 08 196 T2 | 4/1997 |
| JP | 63272335 | 11/1988 |

* cited by examiner

*Primary Examiner*—Paul D Kim

(57) ABSTRACT

The present invention relates to a transverse non-cylindrical gradient coil, having at least one divergent section, and to production methods for such non-cylindrical gradient coils having at least one divergent section having the following steps of production of a planar fingerprint coil or a planar fingerprint coil segment, positioning and attaching the planar coil or planar coil segment on a support plate and formation of a conical saddle coil (51) or a conical saddle coil segment (45) by rolling up the support plate to form a conical surface (50,46).

2 Claims, 5 Drawing Sheets

METHOD OF MANUFACTURING TRANSVERSE NON-CYLINDRICAL GRADIENT COILS

CROSS REFERENCE TO RELATED APPLICATIONS

This application claims priority to the German application No. 10 2004 005 278.6, filed Feb. 3, 2004 which is incorporated by reference herein in its entirety.

FIELD OF INVENTION

The present invention relates generally to magnetic resonance tomography MRT as used in medicine to examine patients. The present invention thereby relates to a transverse non-cylindrical gradient coil, which has at least one divergent section, and to production methods for such non-cylindrical gradient coils having at least one divergent section.

BACKGROUND OF INVENTION

MRT is based on the physical phenomenon of magnetic resonance and has been used successfully as an imaging method in medicine and biophysics for more than 15 years. With this examination method the object is exposed to a strong and constant magnetic field. This orients the nuclear spin of the atoms in the object, which were previously random. High frequency waves can now energize this "ordered" nuclear spin to produce a specific oscillation. In the MRT this oscillation generates the actual measurement signal, which is picked up by suitable receiver coils. The use of non-homogenous magnetic fields, generated by gradient coils, means that the measurement object can be spatially coded in all three spatial directions. The method allows free selection of the layer to be mapped, so that sectional images of the human body can be acquired in all directions. MRT, as a sectional image method in medical diagnosis, is primarily characterized as a "non-invasive" examination method by its versatile contrast capability. MRT currently uses applications with a high gradient power, which allow excellent image quality with measuring times in seconds and minutes. The continued constant technical development of components for MRT devices and the introduction of fast imaging sequences opened up an increasing number of areas for the use of MRT in medicine. Real time imaging to assist with minimally invasive surgery, functional imaging in neurology and perfusion measurement in cardiology are just a few examples.

FIG. 1 shows a schematic section through an MRT device according to the prior art. The section shows further components of an inner chamber 21 enclosed by a basic field magnet 1. The basic field magnet 1 contains superconducting magnet coils in liquid helium and is surrounded by a magnet casing 12 in the form of a twin-shell tank. In the inner chamber enclosed in the magnet casing 12 (also referred to as the magnet vessel) the gradient coil 2 is suspended concentrically over support elements 7. The gradient coil 2 comprises three coil segments, which generate three orthogonal gradient fields in the inner chamber 21: a Maxwell coil, which generates a cylindrical gradient field along the longitudinal axis of the patient (z axis) and is therefore referred to as the axial (gradient) coil and two saddle coil pairs rotated through 90° in respect of each other, which are arranged on the cylindrical lateral surface of the gradient coil 2 and are therefore referred to as transverse cylindrical (gradient) coils. Inside the gradient coil 2 a support tube is also concentrically suspended with the high frequency antenna attached to it. The support tube and HF antenna are hereafter referred to as the HF resonator or the body coil BC 13. The gradient coil 2 and body coil 13 thus represent two cylinders inserted one into the other, which either fit together or are at a maximum radial distance—in the form of an air gap—of around 3 cm from each other. The HF antenna has the task of converting the HF pulses emitted by a power transmitter to a magnetic alternating field to energize the atomic cores in the patient 18 and then to receive the core resonance signal, i.e. to convert the alternating field from the presiding core moment to a voltage fed to the receiver branch. The upper part of the body coil 12 is connected mechanically to the magnet casing 12 by means of a cover 29 that is funnel-shaped for design purposes. So-called tabs 30 are mounted in the lower part of the inner chamber 21. The patient 18 is inserted on a patient table 19 over slide rails 17 into the opening or the inner chamber of the system. The patient table is supported on a vertically adjustable support frame 26.

In one possible embodiment of the MRT device—with the new Integrated Field Generator IFG concept—the transverse saddle coil pairs are made up of two half sections, i.e. two shorter tubes, each containing portions of the gradient coil and producing the functionality of a single gradient coil by means of interconnection.

SUMMARY OF INVENTION

This new gradient coil design concept has clear advantages with regard to the system performance of MR gradient systems.

An object of the present invention is therefore to adapt transverse saddle coils of extremely complex form, i.e. to find a coil design, with which the transverse saddle coils move away from the simpler, single-piece cylindrical forms. It is also the object of the present invention to propose a method for producing such new gradient coils.

This object is achieved by the claims. The dependent Claims develop the central idea of the invention in a particularly advantageous manner.

A method is claimed for producing non-cylindrical transverse gradient coils or gradient coil segments with a conical axial form for a magnetic resonance tomography device having the following steps;

production of a planar fingerprint coil or planar fingerprint coil segment positioning and attaching the planar coil or planar coil segment on a support plate formation of a conical saddle coil or conical saddle coil segment by rolling the support plate up to form a conical surface.

The production of a planar fingerprint coil or planar fingerprint coil segment is thereby achieved by known forming methods, such as punching, milling, casting etc. or by inserting the conductor into a planar insertion form.

A method is also claimed for producing non-cylindrical transverse gradient coils or gradient coil segments with a conical axial form for a magnetic resonance tomography device having the following steps;

production of a conical saddle coil or conical saddle coil segment attaching the conical saddle coil or conical saddle coil segment to the lateral surface of a support.

The production of a conical saddle coil or conical saddle coil segment is advantageously achieved by known forming methods, e.g. punching, milling, casting, etc. or by inserting the conductor into a conical insertion form or by positioning the conductor on a conical winding mandrel or a conical support plate.

A method is also claimed according to the invention for producing non-cylindrical gradient coils with a conical end section for a magnetic resonance tomography device having the following steps;
- production of a conical saddle coil segment according the invention
- production of a cylindrical saddle coil segment
- connection of the respectively associated open ends-of the two saddle coil segments.

A method is also claimed according to the invention for producing non-cylindrical gradient coils with at least one perpendicular and/or conical section for a magnetic resonance tomography device having the following steps
- production of two cylindrical saddle coil segments of different radius
- attaching the cylindrical saddle coil segments to the lateral surface of a support
- connection of the respectively associated open ends of the two saddle coil segments to connecting conductors.

According to the invention the surface in which the connecting conductors are located represents a truncated cone surface.

In a further embodiment of the invention the surface in which the connecting conductors are located represents a flat annular surface.

According to the invention the connecting conductors are advantageously part of one or both saddle coil segments and are bent accordingly to connect with the respective corresponding ends of the corresponding saddle coil segments.

According to the invention connection is effected by welding, soldering, crimping, etc.

A transverse gradient coil is also claimed for a magnetic resonance tomography device, the saddle coil having at least one divergent section according to the invention.

In a possible embodiment of the inventive gradient coil the divergent section forms a step perpendicular to the axial axis.

In a further embodiment the divergent section is conical in form.

The divergent section also extends over an end section of the gradient coil or over the entire length of the gradient coil.

BRIEF DESCRIPTION OF THE DRAWINGS

Further advantages, features and characteristics of the present invention are described in more detail below with reference to exemplary embodiments relating to the accompanying drawings, in which.

Detail A shows the enlarged section of the transition between the two saddle coil segments.

Figure 3A:
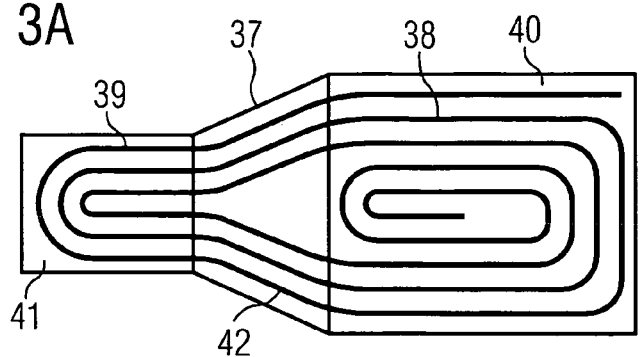

FIG. 3A shows a top view of the upper half of a transverse saddle coil having two different cylinder radii with a conical transition.

Figure 3B:
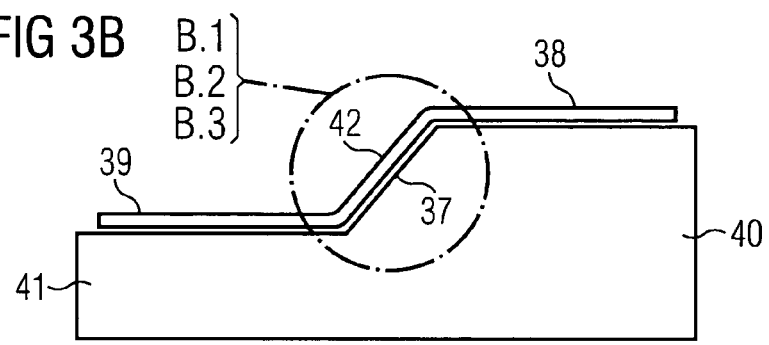

FIG. 3B shows the transverse saddle coil with a conical transition according to FIG. 3A in cross section.

Figure 3C:
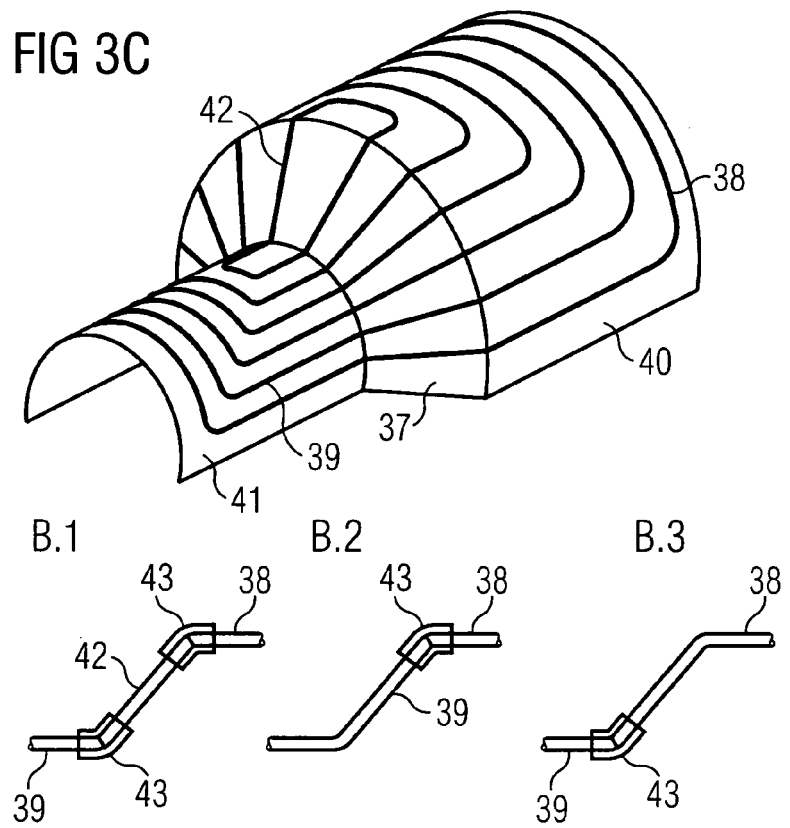

FIG. 3C shows a perspective view of the upper half of a transverse saddle coil according to FIG. 3A.

Detail B shows the enlarged section of the conical transition.

Figure 4A:
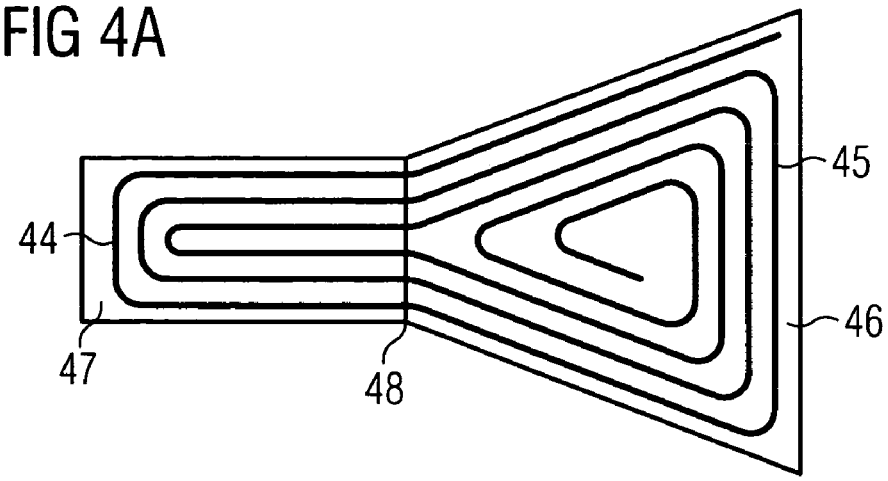

FIG. 4A shows a top view of the upper half of a transverse saddle coil with a cylindrical section and a conical end section.

Figure 4B:
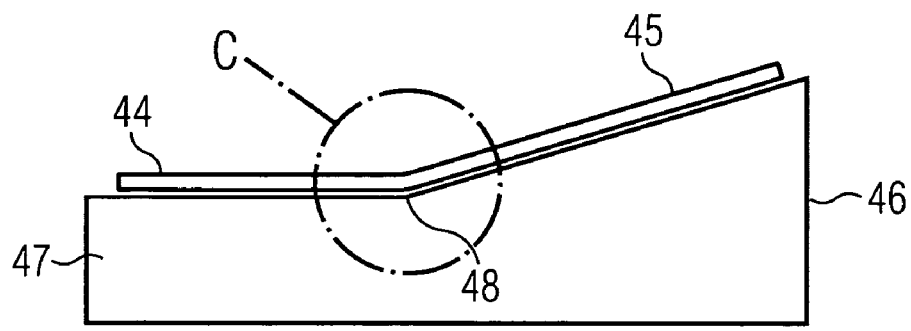

FIG. 4B shows a cross section of the connected saddle coil segments with an obtuse transition.

Figure 4C:
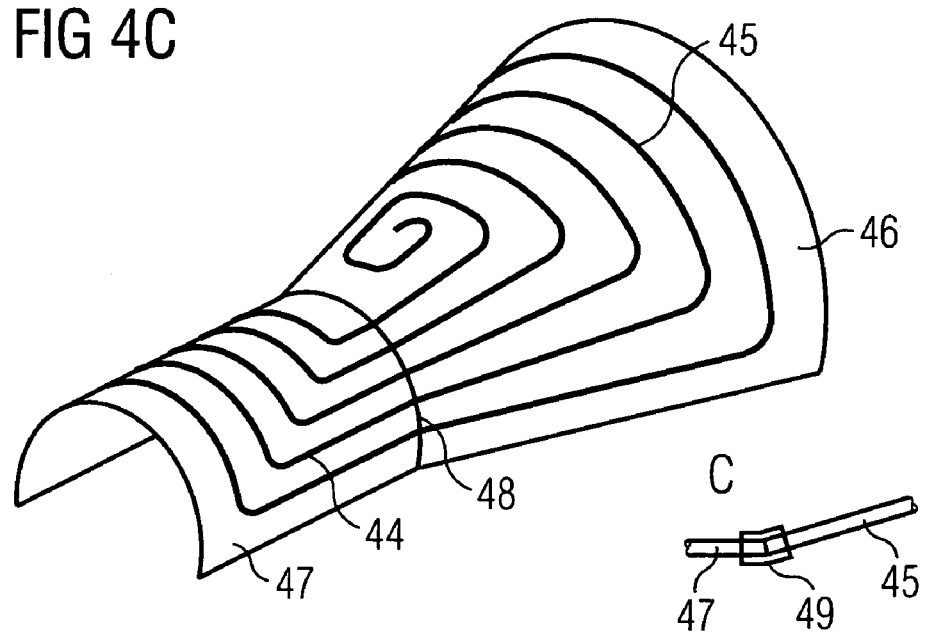

FIG. 4C shows the upper half of the saddle coil according to FIG. 4A in a perspective view.

Detail C shows an enlargement of the obtuse transition.

Figure 5A:
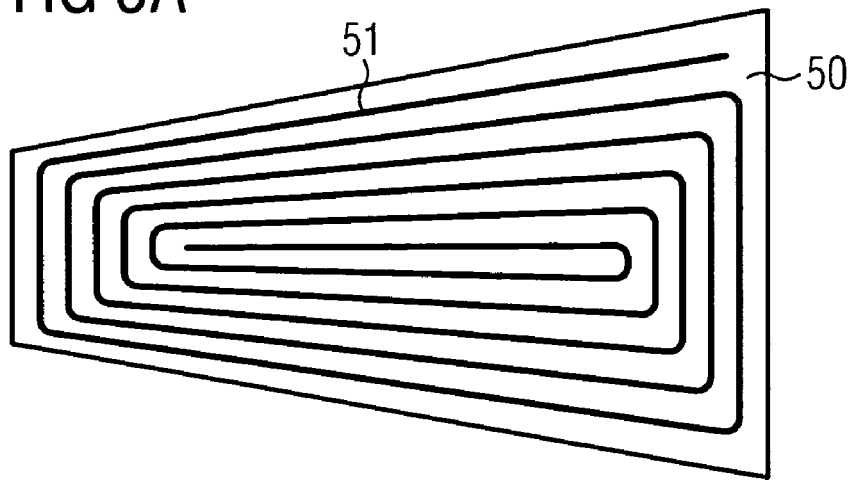

FIG. 5A shows a top view of the upper half of a transverse saddle coil with a conical form.

Figure 5B:
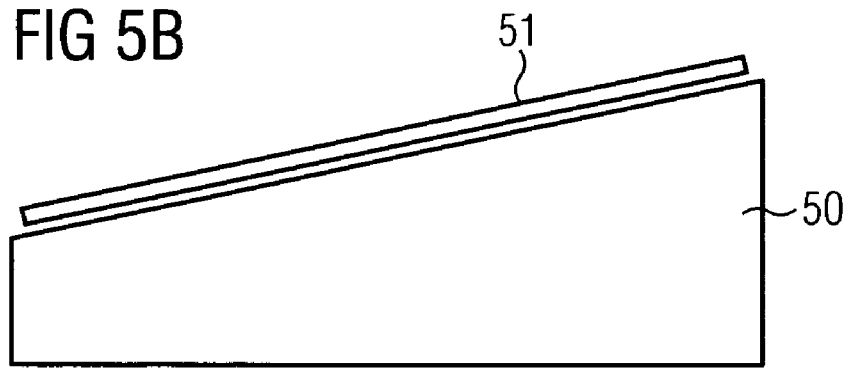

FIG. 5B shows the upper half of the conical transverse saddle coil according to FIG. 5A in cross section.

Figure 5C:
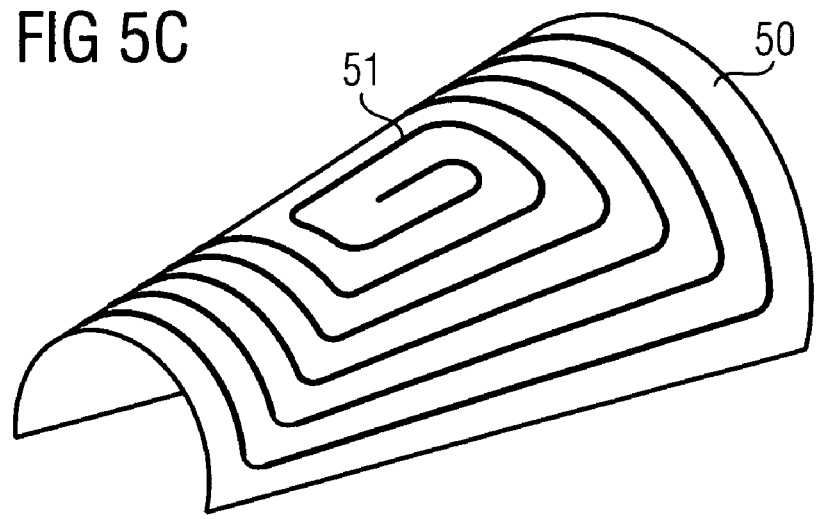

FIG. 5C shows the upper half of the conical transverse saddle coil in a perspective view.

DETAILED DESCRIPTION OF INVENTION

Figure 1:
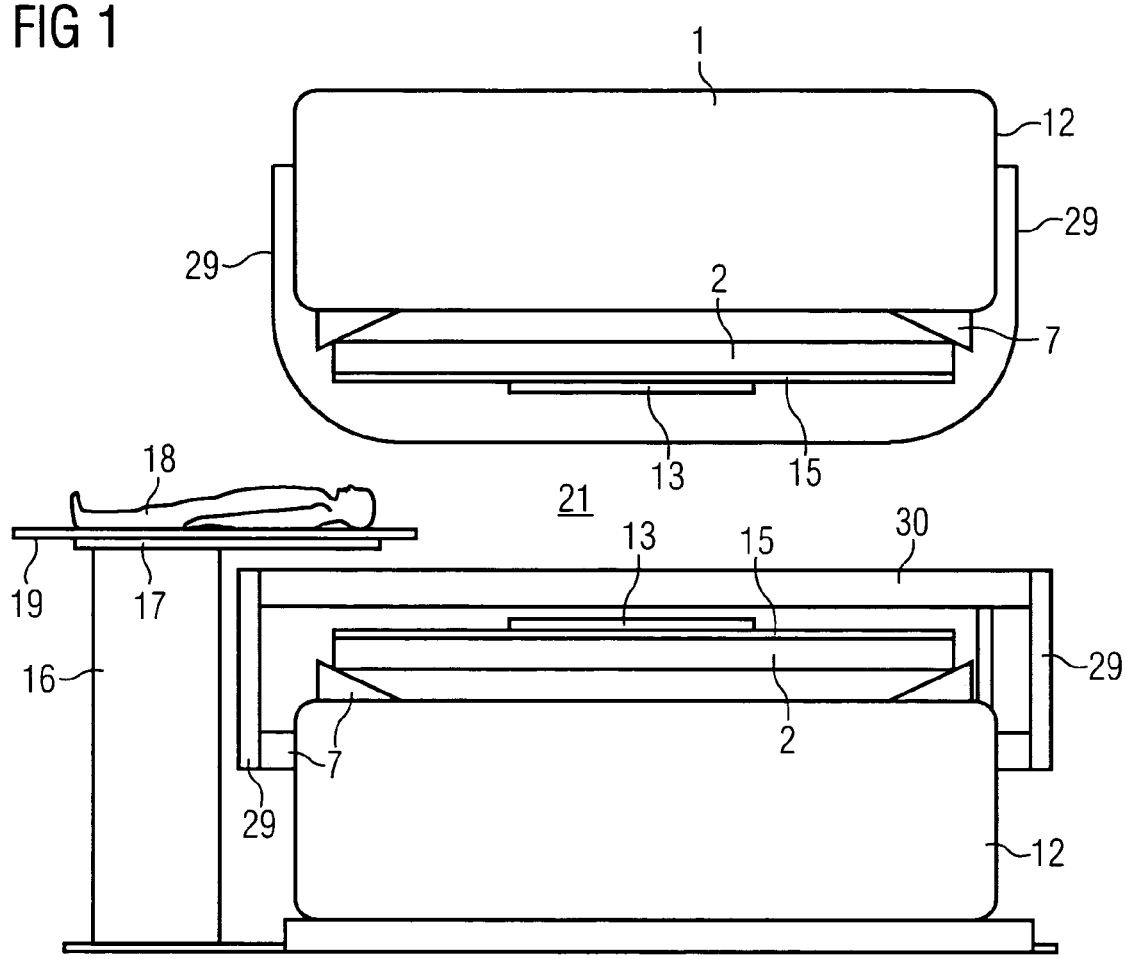
FIG. 1 shows a schematic section through an MRT device with a cylindrical single-piece gradient coil according to the prior art.
Figure 2A:
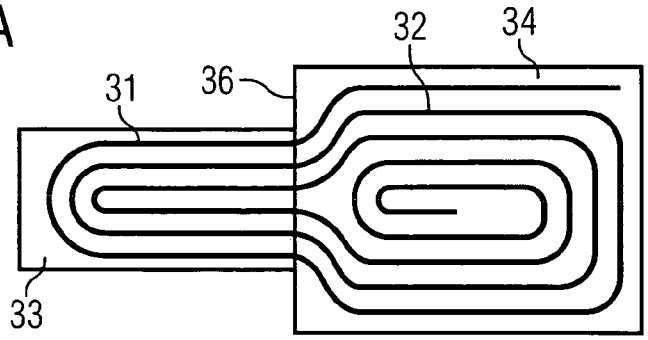
FIG. 2A shows the top view of the upper half of a transverse saddle coil having two different cylinder radii.
Figure 2B:
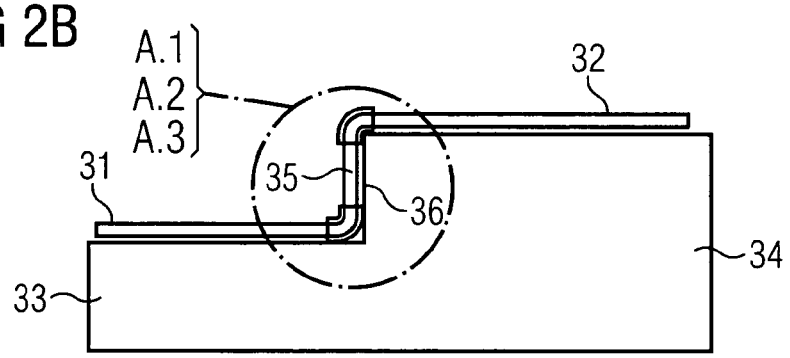
FIG. 2B shows a cross section of the connected saddle coil segments with a perpendicular transition.
Figure 2C:
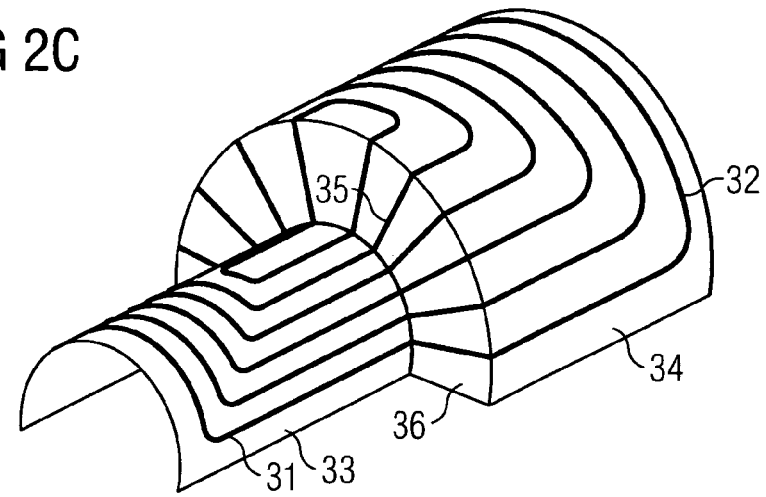
FIG. 2C shows a perspective view of the upper half of a transverse saddle coil according to FIG. 2A.
Figure 2C:
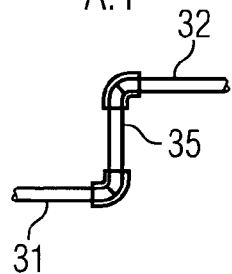
Figure 2C:
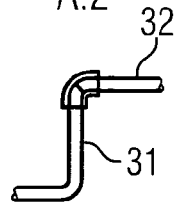
Figure 2C:
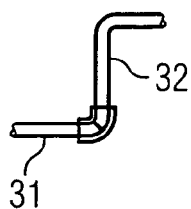

The upper part of a simple modified embodiment of a gradient coil according to the EFG concept (cylindrical in more than one piece with at least one divergent section) is shown in FIGS. 2A, 2B and 2C. It comprises an arrangement of two saddle-shaped saddle coil segments 31,32 on two half shells 33, 34 respectively each with different cylinder radii and a perpendicular transition 36 between the two half shells 33,34 and therefore the saddle coil segments 31,32. The perpendicular transition thus represents a divergent section of the gradient coil, as a result of which the entire gradient coil loses its cylindrical form. FIG. 2A shows a top view of such a coil. The perpendicular transition 36 is clear in FIG. 2B: the different radii of the two joined upper half shells 33,34, produces a step-shaped divergent section 36 perpendicular to the cylinder axis, across which the two (open) saddle coil segments 31,32 cannot be joined directly to each other. The saddle coil segments in the form of saddle-shaped (fingerprint) coils 31,32 are therefore produced separately, separation taking place in a plane 36 perpendicular to the axis of the cylinder. The separately produced saddle coil segments 31,32 are connected according to detail A by soldering, welding, crimping or further clamped connections of connecting conductors 35 (or connecting conductor sections) to the respectively associated open conductor ends of the saddle coil segments 31,32.

The saddle coil segments can be produced according to the conventional prior art, by inserting the electrical conductor for example into a winding form or winding it onto a winding device and then sticking it to a support material (typically a 1 mm glass fiber reinforced epoxy plate) and bending or forming it to the corresponding radius. The support material forms the corresponding half shell 33,34, allowing mechanical fixing (into position) of the saddle coil segment 31,32. The fixing into position of the saddle coil segment 31,32 is effected according to the invention on an assembly mandrel, the geometry of which determines the form of the subsequent gradient coil. In a last section of gradient coil production, the respectively associated open conductor ends of the saddle coil segments 31,32 are connected electrically by soldering, welding, crimping, etc. to connecting conductors 35 (conductor elements) such that a continuous transverse coil winding results over both half shells or saddle coil segments. FIG. 2C shows a perspective view of the upper half of such a transverse, non-cylindrical gradient coil. It shows the two joined half shells 33,34 (as the forming support saddles) with the corresponding saddle coil segments 31,32, which are connected in the area of the divergence 36 by radially arranged connecting conductors 35 to a continuous upper transverse coil winding.

The entire transverse gradient coil for generating a gradient field in a defined transverse (X or Y) direction (not shown) is formed by the combination of coils 31,32 and half shells 33,34 according to FIG. 2B with a complementary lower arrangement.

In a further embodiment of a transverse non-cylindrical gradient coil according to the invention, the divergent section 37 between the two half shells 40,41 is used as an effective field by arranging the connecting conductors 42 conically in relation to the coil axis (the axis of symmetry). FIG. 3A shows the top view of such a coil. The truncated cone shaped transition 37 is also shown in FIGS. 3B and 3C. According to detail B.1 the connecting conductors 42 can run in straight lines between the open conductor ends of the corresponding saddle coil segments 38,39 according to the invention on a similarly conical section 37 (base) of the assembly mandrel referred to above. After effecting the connection 43 according to the method described (soldering, welding, crimping, etc.) the connecting conductors 42 are then simultaneously fixed in position.

As an alternative to the precise positioning of the connecting conductors 42 on a conical section of the assembly mandrel, the connecting conductors 42 can be inserted into a flat winding form or fixed onto a flat support plate and in both cases rolled up to a conical form (conical lateral surfaces). In a further step the connection is then established between the two half shells 40,41 and finally between the open conductor ends of the two saddle coil segments 38,39.

It is also possible during production of the saddle coil segments according to the invention to configure the open conductor ends either of the first 39 or second saddle coil segment 38 in an extended manner such that a conical connection between the two saddle coil segments is effected just by bending the extensions and only one weld-solder-crimp connection etc. 43 has to be created for each open end (B.2, B.3). There is then no need to produce the suitably longer connecting conductor elements 42. The method just described can also be used for a perpendicular divergent section between the saddle coil segments (see detail A.2, A.3).

In a further embodiment of a transverse gradient coil according to the invention, the divergent section of the coil extends over an entire end section 46 of the coil. FIG. 4A for example shows a gradient coil, the left saddle coil segment 44 of which is on a cylindrical half shell 47 and the right saddle coil segment 45 of which is conical in form or has been molded on a conical half shell 46. Various connecting conductors can be dispensed with here too. The left and right saddle coil segments 44,45 are connected at the corresponding points 48 according to the methods mentioned 49 (detail C).

In a further embodiment of a transverse gradient coil according to the invention, the divergent section of the coil extends over the entire coil length. FIGS. 5A, 5B and 5C for example show the upper part of such a gradient coil 51, which comprises a single fingerprint saddle coil, molded on a truncated cone shaped half shell 50 according to the invention. In this case there are no saddle coil segments to connect so the above connection techniques are not required and connecting conductors can be dispensed with.

In order to mold coil windings and connecting conductors, in particular saddle coils or saddle coil segments according to FIGS. 3A to 5C on conical surfaces (conical lateral surfaces) or to give them an axial conical form, according to the invention conical winding mandrels, conical (insertion) winding forms or formable support plates can be used, which according to the invention can be combined with known forming methods (punching, milling, casting, etc.). It is therefore also possible for example to punch or mill the saddle coil segments or connecting conductors out of a conductive surface or to cast them using a corresponding mold. The conical form can thereby be produced during the production process or afterwards in the described manner.

It should also be noted that the inventive idea covers much more complex forms of transverse gradient coil. It would therefore be possible for example to configure a gradient coil with a plurality of divergent sections in combination with different saddle coil segments of any axial form (e.g. parabolic and or shaped like a charlotte mold).

The coil design set out above is not just restricted to gradient coils but can be extended according to the invention to relate to secondary coils (shim coils).

The invention claimed is:

1. A method of manufacturing a non-cylindrical transverse gradient coil or gradient coil segment having a conical axial shape for use with a magnetic resonance tomography device, the method comprising:
  manufacturing a planar fingerprint coil or a planar fingerprint coil segment respectively;
  arranging and attaching the planar fingerprint coil or planar fingerprint coil segment respectively on a carrier plate; and
  forming a conical saddle coil or a conical saddle coil segment respectively by rolling the carrier plate to form a conical surface.

2. The method according to claim 1, wherein manufacturing the planar fingerprint coil or planar fingerprint coil segment respectively includes utilizing at least one forming method chosen from the group consisting of punching, milling, casting and inserting a conductor into a planar insertion form.

* * * * *